United States Patent
Yao et al.

(10) Patent No.: US 8,039,201 B2
(45) Date of Patent: Oct. 18, 2011

(54) ANTIREFLECTIVE COATING COMPOSITION AND PROCESS THEREOF

(75) Inventors: Huirong Yao, Plainsboro, NJ (US); Zhong Xiang, Orlando, FL (US); Jian Yin, Bridgewater, NJ (US); Weihong Liu, Bridgewater, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 11/944,105

(22) Filed: Nov. 21, 2007

(65) Prior Publication Data

US 2009/0130591 A1    May 21, 2009

(51) Int. Cl.
G03C 1/73    (2006.01)
G03F 7/11    (2006.01)
(52) U.S. Cl. .............. 430/271.1; 430/311; 430/326; 430/327; 430/270.1; 525/245; 526/200
(58) Field of Classification Search .............. None
See application file for complete search history.

(56) References Cited

U.S. PATENT DOCUMENTS

| | | | |
|---|---|---|---|
| 3,474,054 A | 10/1969 | White | |
| 3,477,990 A | 11/1969 | Dante et al. | |
| 3,880,946 A | 4/1975 | Labana et al. | |
| 3,956,241 A | 5/1976 | Steele et al. | |
| 4,200,729 A | 4/1980 | Calbo | |
| 4,248,938 A | 2/1981 | Takana et al. | |
| 4,251,665 A | 2/1981 | Calbo | |
| 4,363,896 A | 12/1982 | Chattha | |
| 4,491,628 A | 1/1985 | Ito et al. | |
| 4,510,024 A | 4/1985 | Kishida et al. | |
| 4,734,468 A | 3/1988 | Marx | |
| 4,908,397 A | 3/1990 | Barsotti et al. | |
| 5,187,019 A | 2/1993 | Calbo et al. | |
| 5,350,660 A | 9/1994 | Urano et al. | |
| 5,410,005 A * | 4/1995 | Nemoto et al. | 526/245 |
| 5,597,868 A | 1/1997 | Kunz | |
| 5,631,332 A | 5/1997 | Karasawa et al. | |
| 5,677,380 A | 10/1997 | Matsumura et al. | |
| 5,843,624 A | 12/1998 | Houlihan et al. | |
| 5,886,102 A | 3/1999 | Sinta et al. | |
| 6,265,073 B1 | 7/2001 | Nakamura et al. | |
| 6,410,206 B1 | 6/2002 | Ueda et al. | |
| 6,410,209 B1 | 6/2002 | Adams et al. | |
| 6,447,980 B1 | 9/2002 | Rahman et al. | |
| 6,488,509 B1 | 12/2002 | Ho et al. | |
| 6,652,971 B1 | 11/2003 | Delmotte et al. | |
| 6,663,916 B2 | 12/2003 | Puligadda et al. | |
| 6,670,425 B2 | 12/2003 | Puligadda et al. | |
| 6,680,160 B2 | 1/2004 | Enomoto et al. | |
| 6,686,124 B1 | 2/2004 | Angelopoulos et al. | |
| 6,723,488 B2 | 4/2004 | Kudo et al. | |
| 6,790,587 B1 | 9/2004 | Feiring et al. | |
| 6,818,258 B2 | 11/2004 | Kaneko et al. | |
| 6,818,381 B2 | 11/2004 | Khojasteh et al. | |
| 6,849,377 B2 | 2/2005 | Feiring et al. | |
| 6,866,984 B2 | 3/2005 | Jung et al. | |

(Continued)

FOREIGN PATENT DOCUMENTS

DE    275 125 A1    8/1989

(Continued)

OTHER PUBLICATIONS

"Aliphatic", Grant & Hackh's Chemical Dictionary, Fifth ed, Grant et al eds, McGraw-Hill Book Company, year 1987 no month, p. 22, printed in United STates of America.*

(Continued)

*Primary Examiner* — Cynthia Hamilton
(74) *Attorney, Agent, or Firm* — Sangya Jain

(57) ABSTRACT

The present invention relates to an antireflective composition comprising a polymer, a thermal acid generator and optionally a crosslinking agent, where the polymer comprises at least one hydrophobic unit (1), at least one chromophore unit (2), at least one unit with a crosslinking site (3) and optionally a unit capable of crosslinking the polymer,

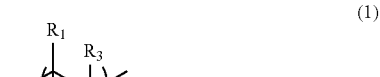

(1)

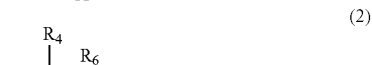

(2)

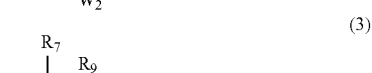

(3)

where, $R_1$ to $R_8$ are independently selected from hydrogen and $C_1$-$C_4$ alkyl, $W_1$ is a fully or partially fluorinated alkylene group, X is selected from F, H and OH; $W_2$ comprises a chromophore group, and $W_3$ Y comprises a crosslinking site. The invention also relates to a process for using the antireflective coating composition.

17 Claims, 1 Drawing Sheet

U.S. PATENT DOCUMENTS

| | | | |
|---|---|---|---|
| 6,894,104 B2 | 5/2005 | Xu et al. | |
| 6,916,590 B2 | 7/2005 | Kaneko et al. | |
| 6,927,266 B2 | 8/2005 | Arase et al. | |
| 6,939,661 B2 | 9/2005 | Kang et al. | |
| 6,956,241 B2 | 10/2005 | Sugawara et al. | |
| 7,081,511 B2 | 7/2006 | Wu et al. | |
| 7,264,913 B2 | 9/2007 | Wu et al. | |
| 7,553,905 B2 | 6/2009 | Abdallah et al. | |
| 7,638,262 B2 | 12/2009 | Wu et al. | |
| 2006/0058468 A1 | 3/2006 | Wu et al. | |
| 2006/0105248 A1* | 5/2006 | Montgomery et al. | 430/5 |
| 2006/0134547 A1* | 6/2006 | Huang et al. | 430/270.1 |
| 2006/0234156 A1 | 10/2006 | Kishioka | |
| 2006/0263720 A1* | 11/2006 | Mori | 430/270.1 |
| 2006/0275696 A1 | 12/2006 | Zampini et al. | |
| 2007/0004228 A1 | 1/2007 | Hatanaka et al. | |
| 2007/0042289 A1* | 2/2007 | Thackeray et al. | 430/270.1 |
| 2007/0105040 A1 | 5/2007 | Toukhy et al. | |
| 2007/0172759 A1 | 7/2007 | Ogihara et al. | |
| 2007/0238029 A1 | 10/2007 | Takei et al. | |
| 2007/0298349 A1 | 12/2007 | Zhang et al. | |
| 2008/0008955 A1 | 1/2008 | Brodsky et al. | |
| 2008/0227037 A1 | 9/2008 | Hatakeyama et al. | |
| 2009/0035704 A1 | 2/2009 | Zhuang et al. | |
| 2010/0015550 A1 | 1/2010 | Liu et al. | |
| 2010/0233634 A1* | 9/2010 | Noya et al. | 430/325 |

FOREIGN PATENT DOCUMENTS

| | | |
|---|---|---|
| EP | 0 864 926 A1 | 9/1998 |
| EP | 1 298 493 A2 | 4/2003 |
| EP | 1 662 769 A1 | 5/2006 |
| EP | 1 736 826 A1 | 12/2006 |
| GB | 2 364 317 A | 1/2002 |
| JP | 1-221702 A | 9/1989 |
| JP | 7-316268 A | 12/1995 |
| JP | 2005-221963 A | 8/2005 |
| WO | WO 02-36692 A2 | 5/2002 |
| WO | WO 03/067329 A1 | 8/2003 |
| WO | WO 2005/093513 A2 | 6/2005 |
| WO | WO 2006/030320 A2 | 3/2006 |
| WO | WO 2006/040918 A1 | 4/2006 |
| WO | WO 2006/040922 A1 | 4/2006 |
| WO | WO 2007094299 A1 * | 8/2007 |

OTHER PUBLICATIONS

"Aliphatic compounds", IUPAC Goldbook, two pages, http//goldbook.iupac.org/A00217.html, original source, PAC, 1995, 67, 1307 (Glossary of class names of organic compounds and reactivity intermediates based on structure (IUPAC Recommendations 1995) on p. 1313.*

M. Switkes et al., "Immersion Liquids for Lithography in the Deep Ultraviolet", Proc. Of SPIE vol. 5040, pp. 690-pp. 699, 2003.

English Language Abstract from EPO of JP 1-221702 A, date submited May 7, 2009.

Notification of Transmittal of the International Search Report and the Written Opinion of the International Searching Authority, or the Declaration (Form PCT/ISA/220), International Search Report (Form PCT/ISA/210), and Written Opinion of the International Searching Authority (Form PCT/ISA/237) for PCT/IB2008/003215, date submitted May 7, 2009.

Derwent-ACC-No: 1990-186312, Derwent-Week: 199025, abstract and clipped image of DD 275126A, 4 pages, year available 1990.

Office Action mail date Aug. 24, 2009 for U.S. Appl. No. 11/833,361.

Form PCT/ISA/220, Form PCT/ISA/210, and Form PCT/ISA/237 for PCT/IB2009/005459 mailed Sep. 23, 2009 which corresponds to U.S. Appl. No. 12/174,718.

Form PCT/ISA/220, Form PCT/ISA/210, and Form PCT/ISA/237 for PCT/IB2008/002064 mailed Jan. 16, 2009 which corresponds to U.S. Appl. No. 11/833,361.

Kodama et al., "Synthesis of Novel Fluoropolymer for 157nm Photoresists by Cyclo-polymerization", SPIE vol. 4690, pp. 76-pp. 83 (2002).

Nakano et al., "Thermal cationic curing with benzylammonium salts—2", Progress in Organic Coatings vol. 28, pp. 143-pp. 148 (1996), obtained from Elsevier press. No month given.

Office Action mail date May 14, 2009 for U.S. Appl. No. 11/833,361.

Office Action mail date May 11, 2010 for U.S. Appl. No. 11/833,361.

Form PCT/IB/326, Form PCT/IB/373, and Form PCT/ISA/237 for PCT/IB2008/002064 mailed Feb. 18, 2010, which corresponds to U.S. Appl. No. 11/833,361.

Office Action mail date Dec. 24, 2009 for U.S. Appl. No. 12/174,718.

Office Action mail date Aug. 19, 2010 for U.S. Appl. No. 12/174,718.

Office Action mail date Jun. 14, 2011 for U.S. Appl. No. 12/174,718.

Pham et al, 2005, Epoxy Resins, Encyclopedia of Industrial Chemistry published on line Oct. 15, 2011, abstract from online and pp. 1-3, 7-22, 51-61 and 86-94.

* cited by examiner

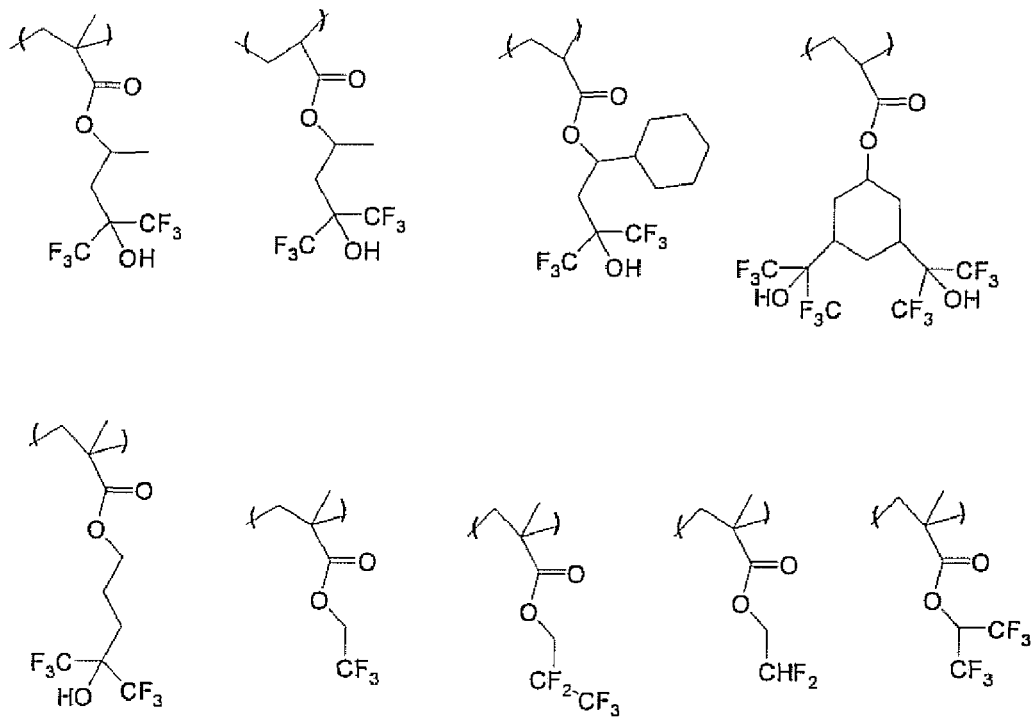
Figure 1: Examples of unit of structure 1
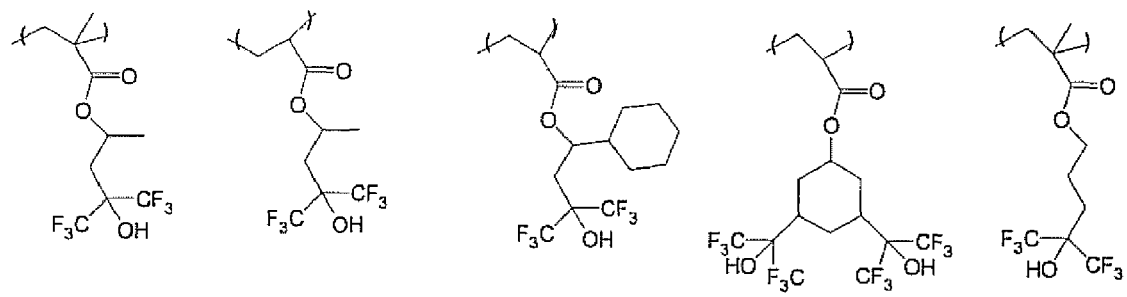
Figure 2: Examples of unit of structure 4

ANTIREFLECTIVE COATING COMPOSITION AND PROCESS THEREOF

FIELD OF INVENTION

The present invention relates to an absorbing antireflective coating composition comprising a polymer with hydrophobic functionality, and a process for forming an image using the antireflective coating composition. The process is especially useful for imaging photoresists using radiation in the deep and extreme ultraviolet (uv) region.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon based wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

Absorbing antireflective coatings and underlayers in photolithography are used to diminish problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the photoresist film as the thickness of the photoresist changes or interference of reflected and incident exposure radiation can cause standing wave effects that distort the uniformity of the radiation through the thickness. Reflective notching becomes severe as the photoresist is patterned over reflective substrates containing topographical features, which scatter light through the photoresist film, leading to line width variations, and in the extreme case, forming regions with complete photoresist loss. An antireflective coating coated beneath a photoresist and above a reflective substrate provides significant improvement in lithographic performance of the photoresist. Typically, the bottom antireflective coating is applied on the substrate and then a layer of photoresist is applied on top of the antireflective coating. The antireflective coating is cured to prevent intermixing between the antireflective coating and the photoresist. The photoresist is exposed imagewise and developed. The antireflective coating in the exposed area is then typically dry etched using various etching gases, and the photoresist pattern is thus transferred to the substrate.

In order to further improve the resolution and depth of focus of photoresists, immersion lithography is a technique that has been used to extend the resolution limits of deep uv lithography imaging. In the traditional process of dry lithography imaging, air or some other low refractive index gas, lies between the lens and the wafer plane. This abrupt change in refractive index causes rays at the edge of the lens to undergo total internal reflection and not propagate to the wafer. In immersion lithography a fluid is present between the objective lens and the wafer to enable higher orders of light to participate in image formation at the wafer plane. In this manner the effective numerical aperture of the optical lens (NA) can be increased to greater than 1, where $NA_{wet}=n_i \sin \theta$, where $NA_{wet}$ is the numerical aperture with immersion lithography, $n_i$ is refractive index of liquid of immersion and $\sin \theta$ is the angular aperture of the lens. Increasing the refractive index of the medium between the lens and the photoresist allows for greater resolution power and depth of focus. This in turn gives rise to greater process latitudes in the manufacturing of IC devices. The process of immersion lithography is described in 'Immersion liquids for lithography in deep ultraviolet' Switkes et al. Vol. 5040, pages 690-699, Proceedings of SPIE The present novel antireflective coating composition is useful for immersion lithography where the antireflective coating has a surface contact angle closely matching that of the photoresist used in immersion lithography. The developed photoresist has good lithographic performance, being free of scum and defects.

SUMMARY OF THE INVENTION

The present invention relates to an antireflective composition comprising a polymer, a thermal acid generator and optionally a crosslinking agent, where the polymer comprises at least one hydrophobic unit (1), at least one chromophore unit (2), at least one unit with a crosslinking site (3) and optionally a unit capable of crosslinking the polymer,

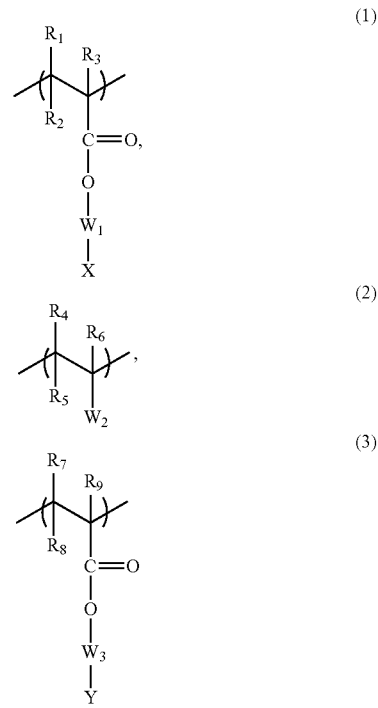

where, $R_1$ to $R_9$ are independently selected from hydrogen and $C_1$-$C_4$ alkyl, $W_1$ is a fully or partially fluorinated group, X is selected from F, H and OH; $W_2$ is an organic moiety comprising a chromophore group, and $W_3Y$ comprises a crosslinking site. The composition may further comprise a compound capable of crosslinking the polymer.

In one embodiment, the unit (1) has the structure (4),

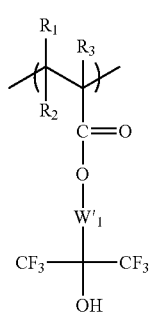

(4)

where $R_1$ to $R_3$ are independently selected from hydrogen and $C_1$-$C_4$ alkyl, and $W'_1$ is a single bond or a $C_1$-$C_{20}$ alkylene group.

The invention also relates to a process for using the antireflective coating composition.

BRIEF DESCRIPTION OF DRAWINGS

FIG. 1 shows examples of structure (1).
FIG. 2 illustrates examples of structure (4).

DESCRIPTION OF THE INVENTION

The present invention relates to an antireflective composition comprising a polymer, a thermal acid generator and optionally a crosslinking agent, where the polymer comprises at least one unit of structure (1) comprising a hydrophobic moiety, at least one unit of structure (2) comprising a chromophore moiety, and at least one unit of structure (3) comprising a crosslinking site. The polymer may further comprise a unit comprising a group capable of crosslinking the polymer. The composition may further comprise a compound capable of crosslinking the polymer. The present invention also relates to a process for imaging a photoresist coated over the novel antireflective coating composition.

The polymer of the present novel antireflective coating composition comprises at least one unit of structure (1) comprising a hydrophobic moiety, at least one unit of structure (2) comprising a chromophore moiety, at least one unit of structure (3) comprising a crosslinking site (3) and optionally a unit comprising a group capable of crosslinking the polymer, where the structures 1-3 may be represented by,

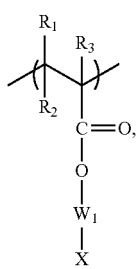

(1)

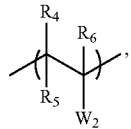

(2)

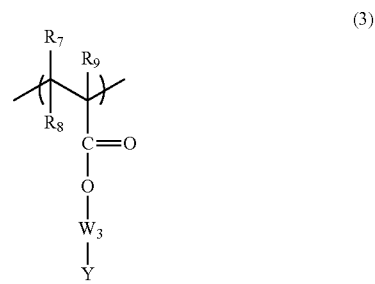

(3)

where, $R_1$ to $R_9$ are independently selected from hydrogen and $C_1$-$C_4$ alkyl; $W_1$ is a fully or partially fluorinated group; X is selected from F, H, and OH; $W_2$ is an organic moiety comprising a chromophore group, and $W_3$ Y comprises a crosslinking site. In the polymer, the unit comprising the hydrophobic moiety, $W_1$, is a fully or partially fluorinated group. $W_1$ is preferably a nonaromatic group, and may be selected from a fluorinated aliphatic alkylene and partially fluorinated aliphatic alkylene such as a $C_1$-$C_{20}$ alkylene selected from linear alkylene, branched alkylene, cyclic alkylene and mixtures of these. The alkylene group may be substituted by other functionalities, such as alkoxy and alkyl carboxyl groups. In one embodiment $W_1$ is not a multicyclic aliphatic alkylene and is also not aromatic and maybe a fully or partially fluorinated $C_1$-$C_{20}$ alkylene which is selected from linear, branched, monocyclic, and mixture of these. $W_1$ may be represented by fully or partially fluorinated $C_1$-$C_{20}$ alkylene, such as fully or partially fluorinated moieties of methylene, ethylene, propylene, isopropylene, butylene, 1-hexylethylene, etc; further such as 3,5 bishexafluoromethylene-hexane X in structure (1) may be selected from F, H, and OH. In one embodiment X is OH. Further examples of the unit (1) are given in FIG. 1. The backbone of the polymer may be an acrylate or a methacrylate.

In one embodiment of unit (1) of the polymer, X is fluorine and $W_1$ is a fully or partially fluorinated aliphatic $C_1$-$C_{20}$ alkylene. Further examples of $W_1X$ are fully fluorinated aliphatic $C_1$-$C_{20}$ alkanes which are linear, branched, monocyclic or mixtures of these, such as pentafluoropropyl, 2,2,2-trifluoroethyl, and heptafluorobutyl, etc. Further examples of the unit (1) are given in the last 4 structures of FIG. 1.

In one embodiment, the unit (1) in the polymer of the present novel composition may have the structure,

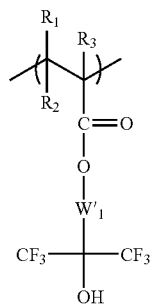

(4)

where, $R_1$ to $R_3$ are independently hydrogen and $C_1$-$C_4$ alkyl, $W'_1$ may be selected from a single bond, an alkylene, substituted alkylene, such as a $C_1$-$C_{20}$ alkylene selected from linear, branched, cyclic and mixtures of these. The alkylene may be substituted with other functionalities such as alkoxy, alkyl carboxyl groups, partially or fully fluorinated alkylene hydroxy groups. Preferably $W'_1$ is a nonaromatic group, and may be selected from a fluorinated aliphatic alkylene and partially fluorinated aliphatic alkylene such as a $C_1$-$C_{20}$ alkylene selected from linear alkylene, branched alkylene, monocyclic alkylene and mixtures of these. $W'_1$ may be represented by fluorinated aliphatic alkylene, partially fluorinated aliphatic alkylene, where the alkylene may be cyclic, linear, branched or a mixture of these. Further examples of $W'_1$ are given in FIG. 2. In another embodiment, $W'_1$ is selected from $C_1$-$C_{12}$ linear alkylene, $C_1$-$C_{12}$ branched alkylene, $C_1$-$C_{12}$ monocyclic alkylene and mixtures thereof, where the alkylene may be substituted with other functionalities such as alkoxy, alkyl carboxyl groups, and partially or fully fluorinated alkylene hydroxy groups. In yet another embodiment $W'_1$ is selected from methylene, ethylene, propylene, isopropylene, 1-hexylethylene, and 3-hexafluoropropanol-hexane.

In the polymer of the present invention, $W_2$ in structure (2) is an organic moiety comprising the chromophore group, where the chromophore group is capable of absorbing the radiation used to expose the photoresist coated over the film of the present antireflective coating composition, such as aromatic groups; examples of chromophore groups are unsubstituted phenyl and substituted phenyl, particularly for 193 nm radiation. Other chromophores may also be used, such as unsubstituted naphthyl, substituted naphthyl, unsubstituted anthracyl, and substituted anthracyl for 248 nm radiation. The chromophore group may be substituted with moieties such as hydroxy, esters, ethers, alkyl carboxyl etc. The chromophore group may be directly linked to the backbone of the polymer or be part of an organic moiety. The organic moiety can be any essentially hydrocarbon moiety comprising carbon and hydrogen, and may additionally contain oxygen. The chromophore group may be attached to the polymer backbone by an ester-group. The chromophore group may be attached through a connecting group, where the connecting group may be an ester, alkylene group, alkyeneoxyalkylene group, alkoxy group, etc. Examples of an alkylene group may be $C_1$-$C_{20}$ alkylene selected from linear, branched, cyclic and mixtures of these. Preferably the connecting group is an aliphatic alkylene or ester. Examples of connecting groups may be methylene, ethylene, propylene, etc. Further examples of $W_2$ are phenyl methylene, phenyl, naphthyl, methylene naphthyl, anthracyl, methylene anthracyl, etc. An example of structure (2) is structure (2')

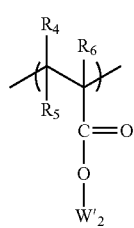

(2')

where $R_4$ to $R_6$ are independently hydrogen and $C_1$-$C_4$ alkyl, and $W'_2$ is an chromophore group connected directly or through a $C_1$-$C_{12}$ alkylene group, where the chromophore group is as described previously. $W'_2$ may be a chromophore group. Specific examples of $W'_2$ may be a phenyl group, a substituted phenyl group, benzyl group or a substituted phenyl group. The polymer may be an acrylate or a methacrylate polymer.

In the polymer of the present invention the unit with the crosslinking site is one capable of causing the polymer to be crosslinked, such that it comprises a group which can crosslink the polymer and become a crosslinking site or provide a site where crosslinking with another group can take place. Groups which can crosslink the polymer are for example epoxy groups, methylol groups, uril groups, etc. Groups which can provide a possible crosslinking site useful for reacting with crosslinking groups are hydroxy. Thus Y in structure (3) could be an epoxy, hydroxy, methylol, uril, etc. Epoxy groups are capable of selfcrosslinking the polymer and do not require an external crosslinking compound. One embodiment of Y is epoxy. One embodiment of Y is hydroxy. If Y is hydroxy and the polymer does not contain a crosslinking group within the polymer, then an external crosslinking compound may be added to the composition. The moiety Y may be connected to the ester group through $W_3$. Preferably $W_3$ is a nonaromatic group, such as an aliphatic group. $W_3$ may be an aliphatic alkylene group, aliphatic alkyene ether group, etc. Examples of an alkylene group may be $C_1$-$C_{20}$ alkylene selected from linear, branched, cyclic and mixtures of these. Examples of $W_3$ are methylene, ethylene, propylene, butylenes, hexylenes, etc. The polymer of the present composition may contain unit of structure (1), a unit of structure (2) and one or more types of unit (3). The polymer may contain multiple types of unit (3), such as one unit where Y is hydroxy and one unit where Y is epoxy. Specific examples of $W_3Y$ are methylene epoxy, ethylene epoxy, hexylenemethylene epoxy, etc.

The polymer present in the novel antireflective composition may comprise additional (meth)acrylate monomeric units, such as in structure (5).

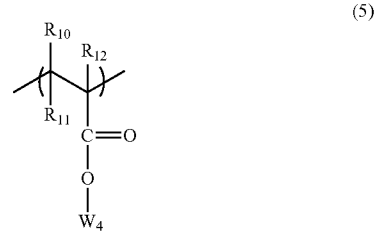

(5)

where $R_{10}$-$R_{12}$ are independently selected from hydrogen and $C_1$-$C_4$ alkyl, $W_4$ is $C_1$-$C_{10}$ alkyl, $C_1$-$C_{10}$ alkyleneetheralkyl, substituted $C_1$-$C_{10}$ alkyl, and substituted $C_1$-$C_{10}$ alkyleneetheralkyl. The substitution may be alkoxy, alkylcarboxyl, alkylester, etc.

In one embodiment of the polymer, the polymer comprises the units shown in structure (6),

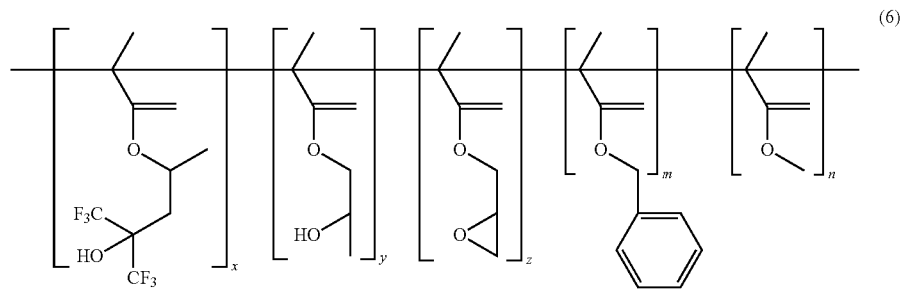

where x, y, z, m and n are mole % of the monomeric units shown, x can range from about 1-50 mole %, preferably about 5-30 mole %; y can range from about 0-50 mole %, preferably about 5-50 mole %; z can range from about 0-50 mole %; m can range from about 5-50 mole % and n can range from about 0-50 mole %, providing y and/or z is greater than 1 mole %.

In the above definitions and throughout the present specification, unless otherwise stated the terms used are described below.

Alkyl means linear or branched alkyl having the desirable number of carbon atoms and valence. The alkyl group is generally aliphatic and may be cyclic or acyclic (i.e. noncyclic). Suitable acyclic groups can be methyl, ethyl, n- or isopropyl, n-,iso, or tert-butyl, linear or branched pentyl, hexyl, heptyl, octyl, decyl, dodecyl, tetradecyl and hexadecyl. Unless otherwise stated, alkyl refers to 1-10 carbon atom moiety. The cyclic alkyl groups may be mono cyclic or polycyclic. Suitable example of mono-cyclic alkyl groups include substituted cyclopentyl, cyclohexyl, and cycloheptyl groups. The substituents may be any of the acyclic alkyl groups described herein. Suitable bicyclic alkyl groups include substituted bicyclo[2.2.1]heptane, bicyclo[2.2.2]octane, bicyclo[3.2.1]octane, bicyclo[3.2.2]nonane, and bicyclo[3.3.2]decane, and the like. Examples of tricyclic alkyl groups include tricyclo[5.4.0.0$^{2,9}$]undecane, tricyclo[4.2.1.2.$^{7,9}$]undecane, tricyclo[5.3.2.0.$^{4,9}$]dodecane, and tricyclo[5.2.1.0.$^{2,6}$]decane. As mentioned herein the cyclic alkyl groups may have any of the acyclic alkyl groups as substituents.

Alkylene groups are divalent alkyl groups derived from any of the alkyl groups mentioned hereinabove. When referring to alkylene groups, these include an alkylene chain substituted with ($C_1$-$C_{18}$)alkyl groups in the main carbon chain of the alkylene group. Alkylene groups can also include one or more alkyne groups in the alkylene moiety, where alkyne refers to a triple bond. Essentially an alkylene is a divalent hydrocarbon group as the backbone. Accordingly, a divalent acyclic group may be methylene, 1,1- or 1,2-ethylene, 1,1-, 1,2-, or 1,3 propylene, 2,5-dimethyl-hexene, 2,5-dimethyl-hex-3-yne, and so on. Similarly, a divalent cyclic alkyl group may be 1,2- or 1,3-cyclopentylene, 1,2-, 1,3-, or 1,4-cyclohexylene, and the like. A divalent tricyclo alkyl groups may be any of the tricyclic alkyl groups mentioned herein above. A particularly useful tricyclic alkyl group in this invention is 4,8-bis(methylene)-tricyclo[5.2.1.0.$^{2,6}$]decane.

Alkoxy means straight or branched chain alkoxy having 1 to 10 carbon atoms, and includes, for example, methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, and 2-ethyloctyloxy.

The term (meth)acrylate refers to methacrylate or acrylate, and similarly, (meth)acrylic refers to methacrylic or acrylic.

Furthermore, and as used herein, the term "substituted" is contemplated to include all permissible substituents of organic compounds. In a broad aspect, the permissible substituents include acyclic and cyclic, branched and unbranched, carbocyclic and heterocyclic, aromatic and non-aromatic substituents of organic compounds. Illustrative substituents include, for example, those described hereinabove. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms. This invention is not intended to be limited in any manner by the permissible substituents of organic compounds.

The polymers of this invention may be synthesized using any known method of polymerization, such as free-radical polymerization using a catalyst. The polymer may be synthesized using solution, emulsion, bulk, suspension polymerization, or the like. The polymers of this invention are polymerized to give a polymer with a weight average molecular weight from about 1,000 to about 80,000, preferably from about 2,000 to about 40,000. The polydispersity (Mw/Mn) of the free-radical polymers, where Mw is the weight average molecular weight and Mn is the number average molecular weight, can range from 1.0 to 10.0, where the molecular weights of the polymer may be determined by gel permeation chromatography. The polymer of the present novel composition may comprise structure (1) in the range from about 5-50 mole %, structure (2) in the range from about 5-50 mole %, and structure (3) in the range from about 5-50 mole %. Other units when present may be in the range of about 1-50 mole %, preferably about 1-25 mole %.

The novel composition comprising the polymer may also comprise an acid generator, and optionally a crosslinker. The acid generator can be any thermal acid generator capable of generating a strong acid upon heating. The thermal acid generator (TAG) used in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. Examples of thermal acid generators are metal-free sulfonium salts and iodonium salts, such as triarylsulfonium, dialkylarylsulfonium, and diarylakylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. Also, covalent thermal acid generators are also envisaged as useful additives for instance 2-nitrobenzyl esters of alkyl or arylsulfonic acids and other esters of sulfonic acid which thermally decompose to give free sulfonic acids. Examples are diaryliodonium perfluoroalkylsulfonates, diaryliodonium tris(fluoroalkylsulfonyl)methide, diaryliodonium bis(fluoroalkylsulfonyl)methide, diarlyiodonium bis(fluoroalkylsulfonyl)imide, diaryliodonium quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris(fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

A variety of crosslinking agents can be used in the composition of the present invention. Any suitable crosslinking agents that can crosslink the polymer in the presence of an acid may be used. Examples, without limitation, of such crosslinking agents are resins containing melamines, methylols, glycoluril, polymeric glycolurils, benzoguanamine, urea, hydroxy alkyl amides, epoxy and epoxy amine resins, blocked isocyanates, and divinyl monomers. Monomeric melamines like hexamethoxymethyl melamine; glycolurils like tetrakis(methoxymethyl)glycoluril; and aromatic methylols, like 2,6 bishydroxymethyl p-cresol may be used. Crosslinking agents disclosed in US 2006/0058468 and incorporated herein by reference, where the crosslinking agent is a polymer obtained by reacting at least one glycoluril compound with at least one reactive compound containing at least one hydroxy group and/or at least one acid group may be used.

The novel composition may further contain at least one of the known photoacid generators, examples of which without limitation, are onium salts, sulfonate compounds, nitrobenzyl esters, triazines, etc. The preferred photoacid generators are onium salts and sulfonate esters of hydroxyimides, specifically diphenyl iodonium salts, triphenyl sulfonium salts, dialkyl iodonium salts, trialkylsulfonium salts, and mixtures thereof. These photoacid generators are not necessarily photolysed but are thermally decomposed to form an acid.

The antireflection coating composition of the present invention may contain 1 weight % to about 15 weight % of the solids, and preferably 3 weight % to about 10 weight %, of total solution. The polymer may be present in the range of about 50 to about 99.9 weight % of the total solids. The optional crosslinker, when used in the composition, may be present at about 1 weight % to about 30 weight % of total solids. The acid generator, may be incorporated in a range from about 0.1 to about 10 weight % by total solids of the antireflective coating composition, preferably from 0.3 to 5 weight % by solids, and more preferably 0.5 to 2.5 weight % by solids.

The solid components of the antireflection coating composition are mixed with a solvent or mixtures of solvents that dissolve the solid components of the antireflective coating. Suitable solvents for the antireflective coating composition may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The antireflective coating composition comprises the polymer, and other components may be added to enhance the performance of the coating, e.g. monomeric dyes, lower alcohols ($C_1$-$C_6$ alcohols), surface leveling agents, adhesion promoters, antifoaming agents, etc.

Since the antireflective film is coated on top of the substrate and is also subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The antireflective coating of the present invention is hydrophobic after forming a coated film, such that the hydrophobicity closely matches that of the photoresist film coated over the antireflective coating, so that a coating with good uniformity is obtained. The hydrophobicity of the film can be measured by the water contact angle ($CA_{Water}$) of the film, where the contact angle is the angle formed by a drop of water on the baked antireflective coating film. Typically the photoresist film used in immersion lithography has a water contact angle of about 80°. Therefore the water contact angle: of the antireflective coating film is in a similar range of about 75° to about 95°, preferably about 77° to about 85'. When the photoresist is imaged and developed in an aqueous alkaline developer then the developer contact angle of the antireflective coating film should be lower than the contact angle in water, so that the developer has good wetting capability on the antireflective coating surface and helps to reduce defects. The developer may be an alkaline water solution comprising tetramethyl ammonium hydroxide. Preferably the developer contact angle ($CA_{Developer}$) of the antireflective coating of the present invention should be in the range of about 50° to about 70°. $\Delta CA$ ($CA_{Water}$-$CA_{Developer}$) is the difference of the water and developer contact angle. The present antireflective coating composition is capable of forming a film which has a water contact angle higher than the developer contact angle. The $\Delta CA$ % (($CA_{Water}$-$CA_{Developer}$)/$CA_{Water}$) in the water contact angle and the developer contact angle of the antireflective coating composition can range from about 5% to about 25%, preferably 10% to 25%. In one embodiment the ΔCA % is in the range from about 15% to about 25%. In another embodiment the ΔCA % is in the range from about 10% to about 20%.

The absorption parameter (k) of the novel composition ranges from about 0.05 to about 1.0, preferably from about 0.1 to about 0.8 at the exposure wavelength, as derived from ellipsometric measurements. In one embodiment the composition has a k value in the range of about 0.2 to about 0.5 at the exposure wavelength. The refractive index (n) of the antireflective coating is also optimized and can range from about 1.3 to about 2.0, preferably 1.5 to about 1.8. The n and k values can be calculated using an ellipsometer, such as the J. A. Woollam WVASE VU-32™ Ellipsometer. The exact values of the optimum ranges for k and n are dependent on the exposure wavelength used and the type of application. Typically for 193 nm the preferred range for k is about 0.05 to about 0.6, and for 248 nm the preferred range for k is about 0.15 to about 0.8.

The antireflective coating composition is coated on the substrate using techniques well known to those skilled in the art, such as dipping, spin coating or spraying. The film thickness of the antireflective coating ranges from about 15 nm to about 400 nm, preferably about 30 nm to about 120 nm. The coating is further heated on a hot plate or convection oven for a sufficient length of time to remove any residual solvent and induce crosslinking, and thus insolubilizing the antireflective coating to prevent intermixing between the antireflective coating and the layer to be coated above it. The preferred range of temperature is from about 90° C. to about 280° C. The present antireflective coating may be coated over other layer or layers of antireflective coating(s).

A film of photoresist is coated on top of the uppermost antireflective coating or other substrate and baked to substantially remove the photoresist solvent. An edge bead remover may be applied after the coating steps to clean the edges of the substrate using processes well known in the art.

The substrates over which the antireflective coating(s) are formed can be any of those typically used in the semiconductor industry. Suitable substrates include, without limitation, low dielectric constant materials, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists can be any of the types used in the semiconductor industry, provided the photoactive compound in the photoresist and the antireflective coating substantially absorb at the exposure wavelength used for the imaging process. Photoresists useful for immersion lithography are preferred. Typically, photoresists suitable for imaging with immersion lithography may be used, where such photoresists have a refractive index higher than 1.85 and also are hydrophobic having water contact angle in the range of 75° to 95°.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure at 193 nm and 157 nm require non-aromatic polymers since aromatics are opaque at this wavelength. U.S. Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. Nos. 6,447,980 and 6,723,488, and incorporated herein by reference. Two basic classes of photoresists sensitive at 157 nm, and based on fluorinated polymers with pendant fluoroalcohol groups, are known to be substantially transparent at that wavelength. One class of 157 nm fluoroaldohol photoresists is derived from polymers containing groups such as fluorinated-norbornenes, and are homopolymerized or copolymerized with other transparent monomers such as tetrafluoroethylene (U.S. Pat. Nos. 6,790,587, and 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art. Thus photoresists absorbing in the range of about 12 nm to about 250 nm are useful. The novel coatings can also be used in nanoimprinting and e-beam lithography.

After the coating process, the photoresist is imagewise exposed. The exposure may be done using typical exposure equipment. The exposed photoresist is then developed in an aqueous developer to remove the treated photoresist. The developer is preferably an aqueous alkaline solution comprising, for example, tetramethylammonium hydroxide (TMAH). The developer may further comprise surfactant(s). An optional heating step can be incorporated into the process prior to development and after exposure.

The process of coating and imaging photoresists is well known to those skilled in the art and is optimized for the specific type of photoresist used. The patterned substrate can then be dry etched with an etching gas or mixture of gases, in a suitable etch chamber to remove the exposed portions of the antireflective film or multiple layers of antireflective coatings, with the remaining photoresist acting as an etch mask. Various etching gases are known in the art for etching organic antireflective coatings, such as those comprising $O_2$, $CF_4$, $CHF_3$, $Cl_2$, HBr, $SO_2$, CO, etc.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the antireflective coating in the Examples below were measured on a J. A. Woollam VASE32 ellipsometer.

The molecular weight of the polymers was measured on a Gel Permeation Chromatograph.

Static contact angle (SCA) data were collected using VCA 2500XE (Video Contact Angle System) from AST Products, Inc. (9 Linnell Circle, Billerica, Mass. 01821) using Omni-Solv water from EM Science (480 Democrat Road, Gibbstown, N.J. 08027) or AZ® 300MIF Developer, 2.38 weight % tetramethyl ammonium hydroxide (available from AZ® Electronic Materials USA Corp., 70, Meister Ave., Somerville, N.J. 08876). Tests were carried out in Class-1000 Fab environment. Static contact angle were reported as average value from more than five measurements.

Synthesis Example 1

15.9 g of isopropyl hexafluoroisopropanol methacrylate, 8.1 g of benzylmethacrylate, 7.1 g of glycidyl methacrylate, 4.3 g of hydroxypropyl methacrylate and 2.0 g of methyl methacrylate were mixed with 160 g of propyleneglycolmonomethylether acetate (PGMEA) solvent. The polymerization reaction proceeded in the presence of 0.66 g of 2,2'-azobisisobutyronitrile (AIBN) at 75° C. under nitrogen for 18 h. After cooling down to room temperature, the reaction mixture was precipitated in deionized water (DI) water. The white polymer solid was washed and dried in vacuo at 45° C. yielding 36.6 g (98% yield) with a weight average molecular weight of 3600.

Synthesis Example 2

7.4 g of 2,2,3,3,3-pentafluoropropyl methacrylate, 4.3 g of benzylmethacrylate, 3.6 g of glycidyl methacrylate, 2.2 g of hydroxypropyl methacrylate and 1.0 g of methyl methacrylate were mixed in 80 g of PGMEA solvent. The polymerization reaction proceeded in the presence of 0.33 g of AIBN at 75° C. under nitrogen for 18 hours. After cooling down to room temperature, the reaction mixture was precipitated in DI water. The white polymer solid was washed and dried in vacuo at 45° C. yielding 18 g (97% yield).

Synthesis Example 3

15.0 g of isopropyl hexafluoroisopropanol methacrylate, 6.0 g of styrene, 10.0 g of 2-hydroxypropyl methacrylate and 19.0 g of glycidyl methacrylate, was mixed in 200 g of PGMEA solvent. The polymerization reaction proceeded in the presence of 0.97 g of AIBN at 75° C. under nitrogen for 24 hours. After cooling down to room temperature, the reaction mixture was precipitated in DI water. The white polymer solid was washed and dried under vacuum at 45° C. yielding 50.0 g (>99% yield).

Synthesis Example 4

12.9 g of isopropyl hexafluoroisopropanol methacrylate, 7.7 g of benzyl methacrylate, 6.8 g of 2-hydroxyethyl methacrylate and 8.5 g of glycidyl methacrylate, was mixed within 160 g of PGME solvent. The polymerization reaction proceeded in the presence of 1.5 g of AIBN at 75° C. under nitrogen for 6 hours. After cooling down to room temperature, the reaction mixture was precipitated in DI water. The white polymer solid was washed and dried under vacuum at 45° C. yielding 35.5 g (99% yield) with a weight average molecular weight of 2400.

Synthesis Example 5

11.50 g (0.0391 mol) of isopropyl hexafluoroisopropanol methacrylate, 11.0 g (0.0625 mol) of benzyl methacrylate and 27.5 g (0.191 mol) of 2-hydroxypropyl methacrylate, were mixed with in 200 g of PGMEA solvent. The polymerization reaction proceeded in the presence of 0.91 g (0.0055 mol) of AIBN at 75° C. under nitrogen for 24 hours. After cooling down to room temperature, the reaction mixture was precipitated in DI water. The white polymer solid was washed and dried under vacuum at 45° C. yielding 50.0 g (>99% yield).

Synthesis Example 6

1000 grams of tetramethoxymethyl glycoluril, 500 grams of neopentyl glycol and 3000 grams of PGMEA were charged into a 5000 mL flask with a thermometer, a cold water condenser and a mechanical stirrer. The reaction mixture was heated to 85° C. After a catalytic amount of para-toluenesulfonic acid monohydrate was added, the reaction was maintained at this temperature for 8 hours. The reaction solution was then cooled to room temperature and filtered. The polymer was precipitated in DI water and collected on a filter, washed thoroughly with water and dried in a vacuum oven (400 grams were obtained) with a weight average molecular weight of 10,000.

Formulation and Coating Example 7

1.0 g of the polymer from Synthesis Example 1 was dissolved in 30 g of PGMEA/PGME (propyleneglycolmonomether): 70/30 solvent to make a 3.3 wt % solution. 0.1 g of 10% of nanofluorobutanesulfonic acid triethylamine salt in PGMEA/PGME: 70/30 was added to the polymer solution. The mixture was then filtered through a micro filter with a pore size of 0.2 µm. The solution was then spun coated on a silicon wafer for 40 seconds. The coated wafer was then heated on a hot plate for 1 minute at 200° C. The antireflective coating was analyzed on a spectroscopic ellipsometer. The optimized refractive index "n" at 193 nm was 1.75 and the absorption parameter "k" was 0.22.

Formulation and Coating Example 8

0.7 g polymer of the Synthesis Example 5 and 0.3 g polymer of Synthesis Example 6 was dissolved in 30 g of PGMEA/PGME 70/30 solvent to make a 3.3 wt % solution. 0.15 grams of a 10% solution of dibenzyl sulfonic acid triethylamine salt in PGMEA/PGME: 70/30 were placed into the suitable container and stirred until all the components were dissolved. The mixture was then filtered through a 0.2 µm micro filter. The solution was then spin coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.78 and the absorption parameter "k" was 0.21.

Contact Angle Measurements for Formulations 8-12

Formulations 9-12 were prepared and wafers were coated and baked as mentioned in Formulation and Coating Example 7, in which the polymers used were those from Synthesis Example 1-4, respectively. Formulation and Coating Example 8 was also tested. For each coated wafer, five drops of water were added to the center, up, down, left and right areas of wafer, and the contact angle of the water drops was measured by using VCA 2500XE system. Averaging these five contact angle data gave the contact angle of water for each film. The same measurement procedure was followed using developer (AZ® 300 MIF) instead of water and the contact angle of developer on antireflective coating film was measured. Subtracting the contact angle of developer from contact angle of water gave delta(difference) contact angle of the two liquids, ΔCA. The percentage of contact angle difference for water and developer, ΔCA %, (($CA_{Water}-CA_{Developer}$)/$CA_{Water}$) on each film of Formulations 8-12 was calculated and is listed in Table 1.

TABLE 1

Contact Angle Measurements

| Formulation | Polymer Example | $CA_{Water}$ | $CA_{Developer}$ | ΔCA | ΔCA % |
|---|---|---|---|---|---|
| Formulation 9 | 1 | 83.01 | 66.84 | 16.17 | 19.48% |
| Formulation 10 | 2 | 90.42 | 84.72 | 5.70 | 6.30% |
| Formulation 11 | 3 | 78.80 | 63.98 | 14.82 | 18.81% |
| Formulation 12 | 4 | 80.31 | 65.52 | 14.79 | 18.42% |
| Formulation 8 | 5 + 6 | 76.10 | 65.48 | 10.62 | 13.96% |

The polymers containing the fluoroalcohol group in Formulations 9, 11, 12 and 8 gave large % difference in the contact angle (ΔCA %). The higher the fluoroalcohol content in the polymer the higher the ΔCA %.

The invention claimed is:

1. An antireflective composition comprising a polymer, a thermal acid generator and optionally a crosslinking agent, where the polymer comprises at least one hydrophobic unit (1), at least one chromophore unit (2), at least one unit (3) where Y is hydroxyl, at least one unit (3) where Y is epoxy, and optionally a unit capable of crosslinking the polymer,

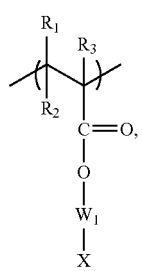

(1)

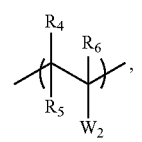

(2)

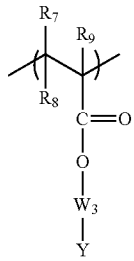

(3)

where, $R_1$ to $R_9$ are independently selected from hydrogen and $C_1$-$C_4$ alkyl, $W_1$ is a fully or partially fluorinated group, X is OH; $W_2$ is an organic moiety comprising a chromophore group, and $W_3$ is an aliphatic group, further where the antireflective composition forms a film after baking for 1 minute at 200° C. with a ΔCA % in the range from about 5% to about 25%, where ΔCA % is the percentage of ($CA_{water}-CA_{developer}$)/$CA_{water}$, where CA is the contact angle, $CA_{water}$ is the contact angle of the film in water after baking for 1 minute at 200° C. and $CA_{developer}$ is the contact angle of the film in a 2.38 weight % tetramethyl ammonium hydroxide aqueous solution after baking for 1 minute at 200° C. and where the film after exposure to radiation is not developable in 2.38 weight % tetramethyl ammonium hydroxide aqueous solution.

2. The antireflective composition according to claim 1 where the unit (1) has the structure,

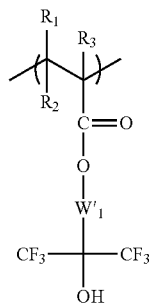

where $R_1$ to $R_3$ are independently selected from hydrogen and $C_1$-$C_4$ alkyl, $W'_1$ is selected from a single bond, a $C_1$-$C_{20}$ alkylene group, and a substituted $C_1$-$C_{20}$ alkylene group.

3. The antireflective composition according to claim 1 where $W_1$ is a nonaromatic group.

4. The antireflective composition according to claim 1 where $W_1$ is a nonaromatic and nonmulticyclic alkylene group.

5. The antireflective composition according to claim 1 where the chromophore group is selected from unsubstituted phenyl and substituted phenyl.

6. The antireflective composition according to claim 1 where the chromophore group is selected from unsubstituted anthracyl and substituted anthracyl.

7. The antireflective composition according to claim 1 where $W_3$ is selected from $C_1$-$C_{20}$ alkylene.

8. The antireflective composition according to claim 1 where the polymer further comprises an additional unit 3, where Y is selected from methylol or uril.

9. The antireflective composition according to claim 1 where the optional unit capable of crosslinking the polymer is a vinyl ester comprising a crosslinking group.

10. The antireflective composition according to claim 1 where the polymer comprises other comonomeric units.

11. The antireflective composition according to claim 1, where the polymer comprises other comonomeric units derived from vinyl alkyl esters.

12. The antireflective composition according to claim 1, where the antireflective composition-film forms a contact angle with water in the range of about 75° to about 95°.

13. The antireflective composition according to claim 1, where the antireflective composition film forms a contact angle with developer in the range of about 50° to about to about 70°.

14. A process for manufacturing a microelectronic device, comprising;

a) providing a substrate with a first layer of an antireflective coating composition from claim 1;
    b) coating a photoresist layer above the antireflective coating layers;
    c) imagewise exposing the photoresist layer;
    d) developing the photoresist layer with an aqueous alkaline developing solution.

15. The process of claim 14, where the first antireflective coating layer has k value in the range of about 0.05 to about 1.0.

16. The process of claim 14, where the photoresist is sensitive from about 250 nm to about 12 nm.

17. The process according to claim 14, where the developing solution is an aqueous solution comprising a hydroxide base.

* * * * *